US006574155B2

(12) United States Patent
Nygren

(10) Patent No.: US 6,574,155 B2
(45) Date of Patent: Jun. 3, 2003

(54) REDUNDANT MULTIPLEXER FOR A SEMICONDUCTOR MEMORY CONFIGURATION

(75) Inventor: Aaron Nygren, München (DE)

(73) Assignee: Infineon Technologies AG, Munich (DE)

( * ) Notice: Subject to any disclaimer, the term of this patent is extended or adjusted under 35 U.S.C. 154(b) by 15 days.

(21) Appl. No.: 09/805,295

(22) Filed: Mar. 13, 2001

(65) Prior Publication Data

US 2001/0021132 A1 Sep. 13, 2001

(30) Foreign Application Priority Data

Mar. 13, 2000 (DE) .......................................... 100 12 104

(51) Int. Cl.[7] ................................................. G11C 7/00
(52) U.S. Cl. ................... 365/200; 365/201; 365/230.02
(58) Field of Search ................................ 365/200, 201, 365/230.02

(56) References Cited

U.S. PATENT DOCUMENTS

| 5,493,531 A | * | 2/1996 | Pascucci et al. ............. 365/200 |
| 6,118,727 A | * | 9/2000 | Allan et al. ............. 365/230.06 |
| 6,363,020 B1 | * | 3/2002 | Shubat et al. ............... 365/200 |

* cited by examiner

*Primary Examiner*—David Nelms
*Assistant Examiner*—Connie C. Yoha
(74) *Attorney, Agent, or Firm*—Laurence A. Greenberg; Werner H. Stemer; Ralph E. Locher

(57) ABSTRACT

A redundant multiplexer, in which the addresses of two series-connected switches are compared, and the switches are possibly interchanged, to ensure that no faulty bit lines are read. The redundant multiplexer is used in a semiconductor memory configuration having redundant bit lines for replacing faulty bit lines. The redundant bit line received control and switching signals to determine which of the bit lines are to be replaced.

5 Claims, 2 Drawing Sheets

REDUNDANT MULTIPLEXER FOR A SEMICONDUCTOR MEMORY CONFIGURATION

BACKGROUND OF THE INVENTION

Field of the Invention

The present invention relates to a redundant multiplexer for a semiconductor memory configuration for replacing two faulty bit lines by two redundant bit lines, in which information which is stored in fuses and relates to which bit lines are to be replaced is used to produce control and switching signals in a decoder. And in which two redundant areas with the redundant bit lines on both sides of a central bus can be selected by the control and switching signal.

When testing semiconductor memory configurations, the person carrying out the test generally has to decide to burn or to select fuses associated with a faulty bit line that is present, in order in this way to replace the faulty bit line by a redundant bit line.

However, a serious problem occurs if it is necessary to take account of the position of the first faulty bit line, which has already been replaced by a first redundant bit line, when assigning a redundant bit line to a second faulty bit line. This is the situation with the latest generation of redundant multiplexers for eDRAMs.

SUMMARY OF THE INVENTION

It is accordingly an object of the invention to provide a redundant multiplexer for a semiconductor memory configuration that overcomes the above-mentioned disadvantages of the prior art devices of this general type, in which the position of a first faulty bit line which has been replaced by a redundant bit line is taken into account when assigning a second redundant bit line which is intended to replace a second faulty bit line.

With the foregoing and other objects in view there is provided, in accordance with the invention, a semiconductor memory configuration having two redundant bit line areas with redundant bit lines, fuses storing information relating to which of the bit lines are to be replaced, a decoder connected to the fuses and receiving the information and the decoder generating control and switching signals from the information relating to the bit lines to be replaced, and a central bus disposed between the two redundant bit line areas. A redundant multiplexer for the semiconductor memory configuration is provided for replacing two faulty bit lines by two of the redundant bit lines. The redundant multiplexer contains a plurality of series connected switches, and two of the control and switching signals for in each case two of the series connected switches are compared to determine whether the series connected switches are set correctly depending on a number of the faulty bit lines.

According to the invention and in the case of a redundant multiplexer of the type mentioned initially, the object is achieved in that the two control and switching signals for in each case two series-connected switches in the multiplexer are compared in order to determine whether the switches are set correctly depending on the number of faulty bit lines.

Thus, in the redundant multiplexer according to the invention, comparators are located between each two series-connected switches. The comparators compare the decoded address ("1" or "0") sent to each switch with the control and switching signal and, if appropriate, interchange these addresses, if this is necessary, in order that the faulty address which is relatively close in the central redundant areas controls those switches which are relatively close to the memory cell array. Satisfaction of this condition is the only way to prevent data to be read from faulty bit lines. Such faulty reading can thus be precluded by interchanging the addresses by use of the comparators between the switches. When a fault in a first bit line occurs in a semiconductor memory configuration having the redundant multiplexer according to the invention, then the present invention allows a first set of fuses to be burnt in order to correct this fault by the faulty bit line being replaced by a redundant bit line. If a second fault is then found in another bit line, so that there is a second faulty bit line, a second set of fuses can be burnt, and this is done independently of the fault that was determined initially. Therefore, the fault which was determined initially does not need to be stored in a tester once the first set of fuses has been burnt. This makes it possible to save memory space in the tester without any problems.

In conventional configurations, faults need to be stored in the tester since it is necessary to determine the sequence of replacement operations before fuses can be burnt. In the present invention, this sequence is determined directly, so that a fuse can be burnt immediately when a fault occurs.

In accordance with an added feature of the invention, a comparator is disposed between each two of the series connected switches.

In accordance with another feature of the invention, the series connected switches are set such that a faulty control and switching signal with an address which is stored relatively close in the redundant line areas controls those of the series connected switches which are disposed relatively close in a memory cell array of the semiconductor memory configuration.

Other features which are considered as characteristic for the invention are set forth in the appended claims.

Although the invention is illustrated and described herein as embodied in a redundant multiplexer for a semiconductor memory configuration, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
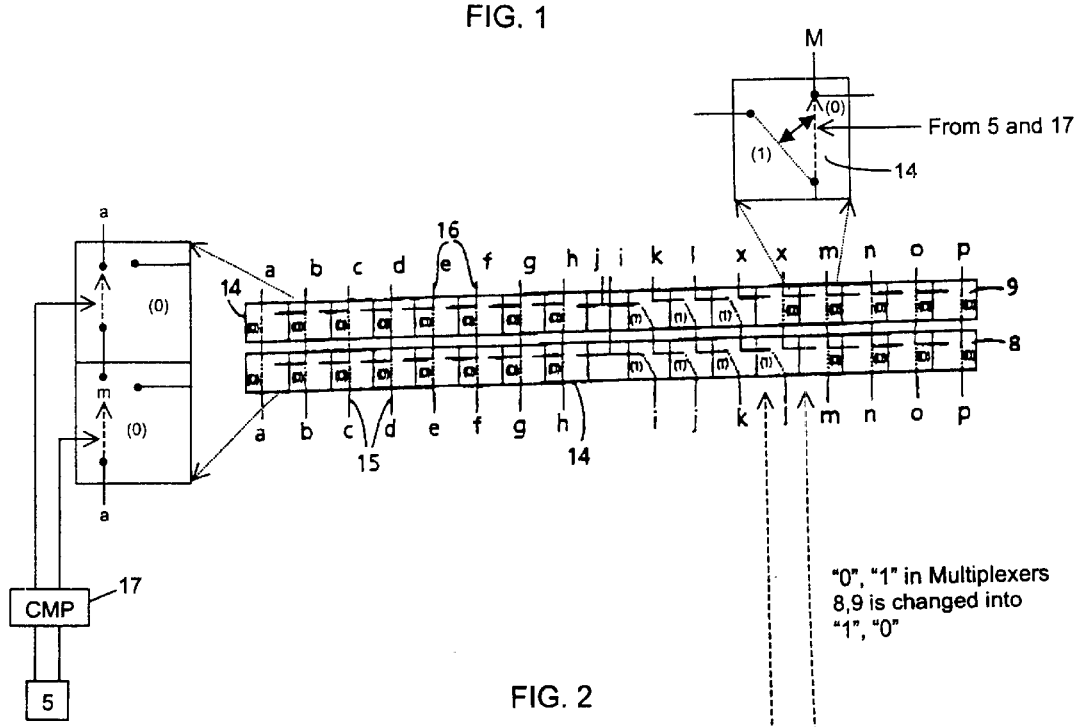
FIG. 1 is an illustration showing an exemplary embodiment of a redundant multiplexer with correctly assigned addresses according to the invention.

In all the figures of the drawing, sub-features and integral parts that correspond to one another bear the same reference symbol in each case. Referring now to the figures of the drawing in detail and first, particularly, to FIG. 4 thereof, there is shown a configuration of a conventional redundant multiplexer for a semiconductor memory configuration. An input/output unit (I/O) 2 is provided on both sides of a central bus or central area 1, into which information is inserted as to which bit lines are faulty and need to be replaced by redundant bit lines. In this case, of course, the number of bit lines that can be replaced by redundant bit lines is limited only by the total number of redundant bit lines. The information relating to the faulty bit lines is stored in fuses (FUSES) 3, so that coded fuse information CFI is available here which indicates which bit lines are faulty and need to be replaced by redundant bit lines. It is now assumed that the coded fuse information CFI is emitted on each side of the central bus 1 via a corresponding fuse bus 4, which is indicated schematically by a dotted line, via a buffer and decoder 5. The buffer and decoder 5 supplies decoded fuse information FI, directly or via control units 6, 7, which are used when reading or writing, to a redundant multiplexer (RMUX) 8, 9.

Figure 4:
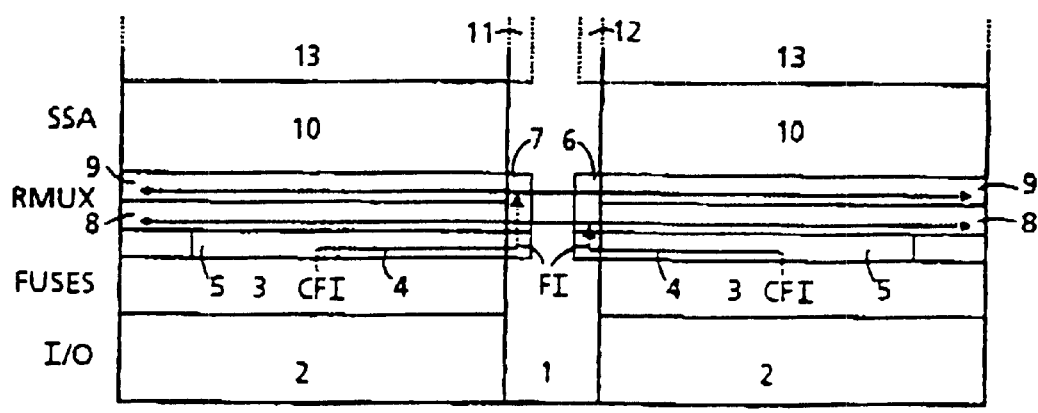
FIG. 4 is an illustration of an existing redundant multiplexer for a semiconductor memory configuration.

Thus, by way of example, the fuses 3 which are located to the right of the central bus 1 in FIG. 4 are used to send the coded fuse information CFI via the buffer and decoder 5, which produces the decoded fuse information FI from the coded fuse information, to the control unit 6. From the control unit 6 the decoded fuse information FI is distributed over the entire interface width of the redundant multiplexer 9 before the associated redundant bit line is actuated in an area 11 of a memory cell array 13 which closely follows a read amplifier 10 (SSA).

When testing semiconductor memory configurations, the person carrying out the test generally has to decide to burn or to select fuses associated with a faulty bit line that is present, in order in this way to replace the faulty bit line by a redundant bit line.

However, a serious problem occurs if it is necessary to take account of the position of the first faulty bit line, which has already been replaced by a first redundant bit line, when assigning a redundant bit line to a second faulty bit line. This is the situation with the latest generation of redundant multiplexers for eDRAMs.

This situation is solved by the redundant multiplexers according to the invention of the instant application. As can be, seen from FIGS. 1 and 2, the redundant multiplexers 8, 9 contain a large number of switches 14, which may have positions (0) and (1). Data are fed into inputs 15 of the switches 14, and are intended to be passed to bit lines which are connected to outputs 16 of the multiplexer 9. If any faulty bit lines "X" are now found, then the control and switching signals supplied from the decoder 5 (see FIGS. 3 and 4) are used to actuate the switches 14 such that the bit lines located to the left of the faulty bit lines "X" in FIG. 1 take over their function, with this function hand over being passed on as far as the redundant bit lines in the area of the central bus 1. For this purpose, the corresponding switches 14 assume the position (1).

FIG. 1 shows directly the manner in which the individual connections "a" . . . "p" of the multiplexer 8 and 9 are associated with one another and how the connections "j" and "i" associated with the redundant areas 11 and 12, respectively, are routed to the redundant bit lines which replace the faulty bit lines "X".

Figure 2:
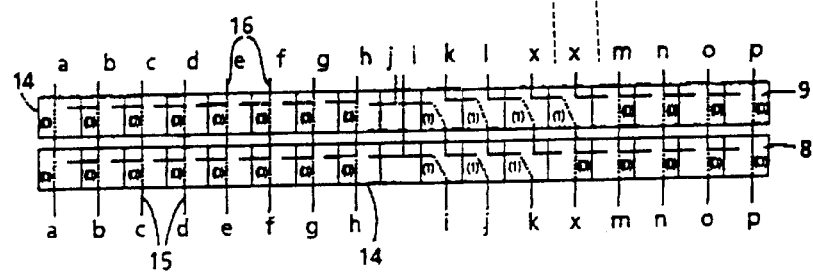
FIG. 2 is an illustration of the multiplexer shown in FIG. 1 with incorrectly assigned addresses.

FIG. 2 shows the same configuration as FIG. 1 with the exception that the switches in the right-hand half with the connections "i" to "p" of the redundant multiplexer 9 or of the multiplexer 8, respectively, are in positions (1,1,1,1,0, 0,0,0; 1,1,1,0,0,0,0,0) instead of (1,1,1,0,0,0,0,0; 1,1,1,1,0, 0,0,0). In other words, the control and switching signals or else "addresses" (0) and (1) for the multiplexers 8 and 9 are applied in FIG. 2 to the switches 14 which are connected to the connection "1" of the multiplexer 8 while, in FIG. 1, these switching and control signals have the values (1) and (0). This interchanging of the addresses in the switch 14 results in the faulty bit line "X" appearing in the multiplexer 8 when reading the memory cell array.

According to the invention, this undesirable result can be avoided by the individual control and switching signals or addresses (1) and (0) being compared with one another and, if necessary, being interchanged, so that the faulty address which is located relatively close in the central redundant areas 11, 12 ("(1)" at the connection 1 of the multiplexer 9) always controls those switches which are located relatively close in the memory cell array.

Figure 3:
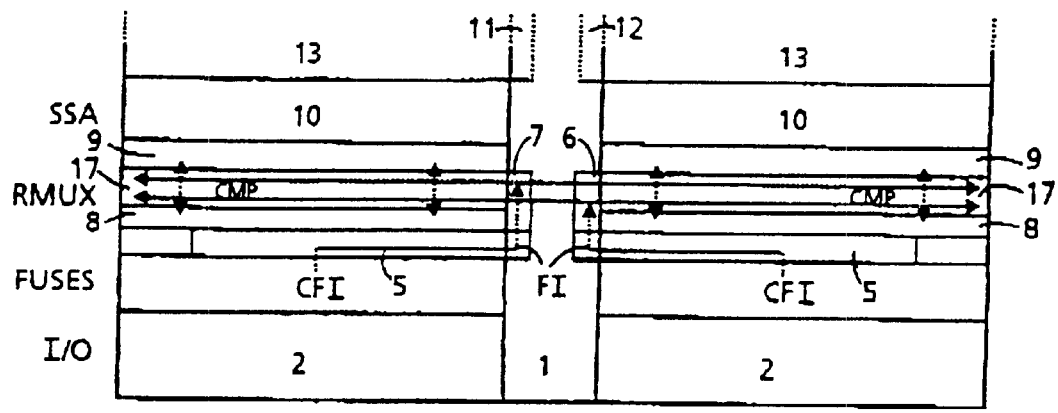
FIG. 3 is a diagrammatic, illustration of the redundant multiplexer according to the invention for a semiconductor memory configuration.

This interchanging process is carried out in a simple manner by comparators 17 which carry out a "CMP" comparison of the control and switching signals of the multiplexers 8, 9 and, if necessary, cause the addresses to be interchanged (FIG. 3).

The invention thus reliably ensures that no faulty bit lines "X" appear when reading the memory cell array 13.

I claim:

1. In a semiconductor memory configuration having two redundant bit line areas with redundant bit lines, fuses storing information relating to which of the bit lines are to be replaced, a decoder connected to the fuses and receiving the information and the decoder generating control and switching signals from the information relating to the bit lines to be replaced, and a central bus disposed between the two redundant bit line areas, a redundant multiplexer for the semiconductor memory configuration for replacing two faulty bit lines by two of the redundant bit lines, the redundant multiplexer comprising:
    a plurality of series connected switches, and two of the control and switching signals for in each case two of said series connected switches are compared to determine whether said series connected switches are set correctly depending on a number of the faulty bit lines.

2. The redundant multiplexer according to claim 1, including a comparator connected to each two of said series connected switches.

3. The redundant multiplexer according to claim 1, wherein said series connected switches are set such that a faulty control and switching signal with an address which is stored relatively close in the redundant line areas controls those of said series connected switches which are disposed relatively close in a memory cell array of the semiconductor memory configuration.

4. A semiconductor memory configuration, comprising:
    two redundant bit line areas having redundant bit lines;
    fuses storing information relating to which bit lines are to be replaced;
    a decoder connected to the fuses and receiving the information and generating control and switching signals from the information relating to the bit lines to be replaced;
    a central bus disposed between the two redundant bit line areas; and
    a redundant multiplexer for replacing two faulty bit lines by two of the redundant bit lines, said redundant multiplexer connected to said decoder and having a plurality of series connected switches, said redundant multiplexer receiving the control and switching signals and two of the control and switching signals for in each case two of said series connected switches are compared in order to determine whether said series connected switches are set correctly depending on a number of faulty bit lines.

5. The semiconductor memory configuration according to claim 4, including a comparator disposed between each two of said series connected switches.

* * * * *